United States Patent
You et al.

(10) Patent No.: US 6,866,148 B2
(45) Date of Patent: Mar. 15, 2005

(54) SPOOL CASE FOR BONDING WIRE, AND METHOD OF HANDLING SPOOL USING SAME

(75) Inventors: Chang Man You, Incheon (KR); Jung Woo Back, Incheon (KR)

(73) Assignee: W.C. Heraeus GmbH & Co. KG, Hanau (DE)

( * ) Notice: Subject to any disclaimer, the term of this patent is extended or adjusted under 35 U.S.C. 154(b) by 233 days.

(21) Appl. No.: 10/285,196

(22) Filed: Oct. 31, 2002

(65) Prior Publication Data

US 2003/0080011 A1 May 1, 2003

(30) Foreign Application Priority Data

Oct. 31, 2001 (KR) ........................................ 2001/67575

(51) Int. Cl.[7] .............................................. B65D 85/67
(52) U.S. Cl. ...................................... 206/397; 206/408
(58) Field of Search ................................ 206/389, 397, 206/398, 403, 407, 408, 409, 413, 415

(56) References Cited

U.S. PATENT DOCUMENTS

| 3,164,252 A | | 1/1965 | Hosbein | |
|---|---|---|---|---|
| 5,053,811 A | * | 10/1991 | Watabe et al. | 355/72 |
| 6,241,094 B1 | * | 6/2001 | Anjo et al. | 206/379 |

FOREIGN PATENT DOCUMENTS

| EP | 826618 | 3/1998 |
|---|---|---|
| EP | 896363 | 2/1999 |
| EP | 1118571 | 7/2001 |
| JP | 54-103747 | 8/1979 |
| JP | 2000-012599 | 1/2000 |
| JP | 2000-112599 | 4/2000 |
| JP | 1171769 | 6/2001 |

* cited by examiner

Primary Examiner—Jacob K. Ackun, Jr.
(74) Attorney, Agent, or Firm—Ostrolenk, Faber, Gerb & Soffen, LLP

(57) ABSTRACT

A bonding wire spool case, and a method of handling a spool using the spool case, with a structure capable of effectively preventing the durability and the holding of the spool from being deteriorated due to the repeated coupling and decoupling operations of the spool with respect to the spool holder while preventing the bonding wire from being contaminated and damaged due to the carelessness of the worker. The bonding wire spool case includes a base having a bottom portion, a sidewall protruding from the bottom portion in a body at four sides thereof while internally forming a spool receipt portion, and a holder entrance formed at one or more sides of the sidewall to pass a spool holder. A spool wound with a bonding wire thereon is mounted to the spool receipt portion in the horizontal direction such that the central axis of the spool is maintained to be parallel to the bottom portion of the base. A cover is coupled to the base at the outer surface of the sidewall while preventing foreign material such as dust from being introduced.

10 Claims, 2 Drawing Sheets

SPOOL CASE FOR BONDING WIRE, AND METHOD OF HANDLING SPOOL USING SAME

BACKGROUND OF THE INVENTION (a) Field of the Invention

The present invention relates to a spool case for storing and carrying a bonding wire of a wire bonding assembly used in manufacturing a semiconductor chip package and a method of handling a spool using the same. More particularly, the invention relates to a bonding wire spool case and a method of handling a spool using the same which can effectively prevent the durability and the holding of the spool from being deteriorated due to the repeated coupling and decoupling operations of the spool with respect to the spool holder, and prevent the bonding wire from being contaminated and damaged due to the carelessness of the worker.

(b) Description of the Related Art

Generally, a wire bonding assembly is a device for electrically connecting a lead of a lead frame to a bonding pad of a semiconductor chip bearing an electrical characteristic by way of a conductive wire such as a high purity platinum Pt wire or an aluminum wire.

The wire bonding assembly is usually provided with a spool, a spool holder, a wire feed guider, a wire clamp, and a capillary. A conductive wire is wound on the spool, and the spool is fitted to the spool holder. The conductive wire is fused by way of the capillary and a torch bar, and welded to the bonding pad of the semiconductor chip and the lead In the wire bonding assembly, the spool wound with a conductive metal wire thereon is usually placed within a spool case, and in that state, it is stored and carried while preventing the contamination and damage thereof. Various kinds of spool cases are used for that purpose.

For instance, Japanese Utility Model Publication Number Sho 54-103747 discloses a spool case having a base with a protrusion onto which a cylindrical spool is inserted, and a cover coupled to the base to prevent a foreign material, such as dust, from being introduced. The cover is provided with a spool case, which has a depressed portion for receiving the spool in correspondence with the protrusion of the base.

The worker grips the flange portion of the spool by hand, and fits it to the spool holder to bring out the spool from the spool case.

Accordingly, with the handling of the spool, the fingers of the worker contact the surface of the conductive wire. In this case, the wire is contaminated and damaged, and this induces serious device failures during the wire bonding process.

Japanese Patent Publication Laid-open No. 2000-012599 discloses a bonding wire spool case having an interfacial coupling member externally fitted around the spool flange to hold the spool, and a base capable of being elastically transformed. The worker presses both lateral sides of the base while elastically transforming the base to remove the spool from the spool case.

However, with the spool case disclosed in Japanese Patent Publication Laid-open No. 2000-012599, the base is formed with a material capable of being elastically transformed such that the spool can be separated from the spool case by way of the interfacial coupling member.

Accordingly, in case the base repeatedly suffers the elastic transformation to make coupling or decoupling of the spool, stress is concentrated at a predetermined region of the base due to the elastic transformation. Consequently, the base is stress-damaged while being deteriorated in its durability.

The interfacial coupling member, which is connected to the base in a body to substantially hold the spool, is formed with an elastic plastic material. With the repeated uses, the interfacial coupling member becomes worn out or blunt, and this deteriorates reliability in the spool holding operation.

Furthermore, with the handling of the spool, the worker picks out the cover from the base, and grips the base to mount the spool to the spool holder of the bonding machine. At this time, the worker may carelessly grip both sides of the base. In this case, the spool holding state of the interfacial coupling member is released so that the spool is separated from the base. Consequently, the bonding wire is contaminated, and damaged.

SUMMARY OF THE INVENTION

It is an object of the present invention to provide a bonding wire spool case and a method of handing a spool using the spool case which can effectively prevent the durability and the holding of the spool from being deteriorated due to the repeated coupling and decoupling operations of the spool with respect to the spool holder, and prevent the bonding wire from being contaminated and damaged due to the carelessness of the worker.

This and other objects may be achieved by a bonding wire spool case and a method of handling a spool using the spool case with the following features.

The bonding wire spool case includes a base having a bottom portion, a sidewall protruding from the bottom portion in a body at four sides thereof while internally forming a spool receipt portion, and a holder entrance formed at one or more sides of the sidewall to pass a spool holder. A spool wound with a bonding wire thereon is mounted to the spool receipt portion in the horizontal direction such that the central axis of the spool is maintained to be parallel to the bottom portion of the base. A cover is coupled to the base at the outer surface of the sidewall while preventing foreign material such as dust from being introduced.

The sidewall supports the spool horizontally placed at the spool receipt portion with a height equal to as much as half the spool, or more. Of course, it is possible that the sidewall supports the spool with a height as much as half the spool, a less.

The holder entrance is preferably provided at two lateral sides of the sidewall facing each other. The holder entrance is formed with a semi-oval groove. A pair of knobs are formed at the cover while facing each other. The knob is protruded toward the spool receipt portion while being positioned corresponding to the semi-oval grooved holder entrance. The protrusion length of the knob is smaller than the thickness of the sidewall.

The holder entrance may bear a rectangular or polygonal shape with a one-sided opening portion for passing the spool holder.

The spool receipt portion is preferably established to support the outer circumference of the flange portions provided at both ends of the spool at three points. The spool receipt portion may be formed with the same outline as the flange portion.

With the above-structured spool case, as the spool is placed within the spool receipt portion, it becomes possible to handle the spool without directly touching the spool by hand. The spool receipt state is not released unless the worker grips the spool, and separates it from the base Furthermore, the durability deterioration with the spool case where the coupling or decoupling of the spool is made through elastically transforming the coupling member and the base is prevented.

As the central axis of the spool is maintained to be in the horizontal direction, the bonding wire wound on the spool deals well with its own load, vibration in its movement and other impacts over its entire length so that the unintended winding or releasing of the wire can be effectively prevented.

With the conventional spool case, separate components such as protrusions should be formed at the base or the cover to make the central axis of the spool be kept in the horizontal direction. By contrast, with the inventive spool case, any separate component is not need to make the central axis of the spool be kept to be in the horizontal direction.

Both ends of the bonding wire wound on the spool are attached to the flange portion of the spool by way of a tape. In case the end portion of the bonding wire is attached to the outer surface of the flange portion, a notch is formed at the flange portion to pass the bonding wire. The notch may be formed at the one-sided flange portion, or at both-sided flange portions.

With the inventive spool case, the spool can be coupled to, or decoupled from the spool holder through sliding the base downward in the direction perpendicular to the spool holder. In this way, the coupling or decoupling of the spool can be made without directly touching the spool by hand.

Furthermore, separation of the spool from the base due to the carelessness of the worker can be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

Figure 1:
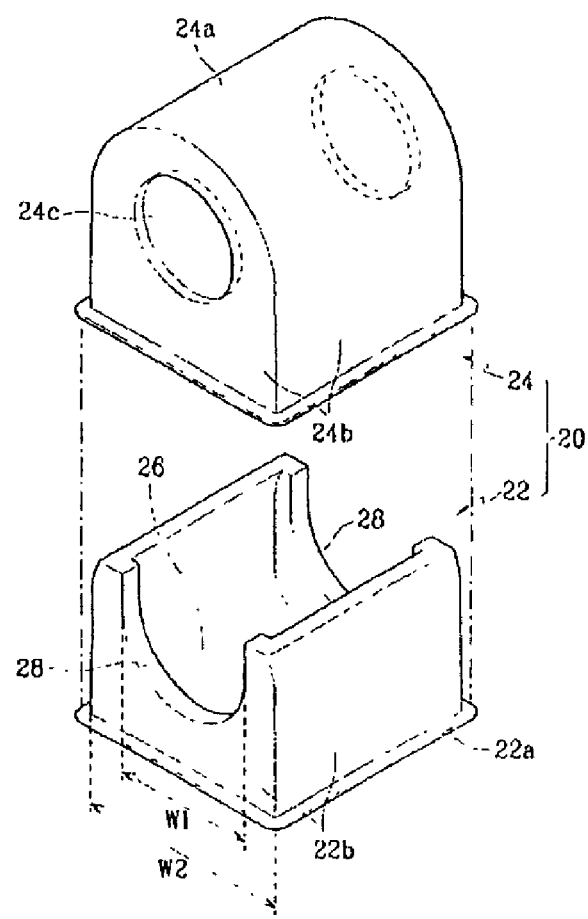
FIG. 1 is an exploded perspective view of a spool case with a cover and a base according to a preferred embodiment of the present invention.
Figure 2:
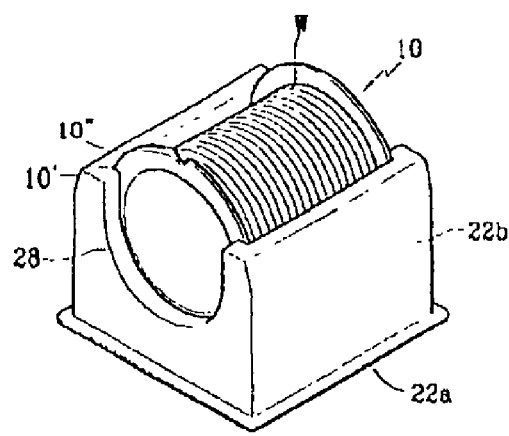
FIG. 2 is a perspective view of the base shown in FIG. 1 mounting a spool therein.
Figure 3:
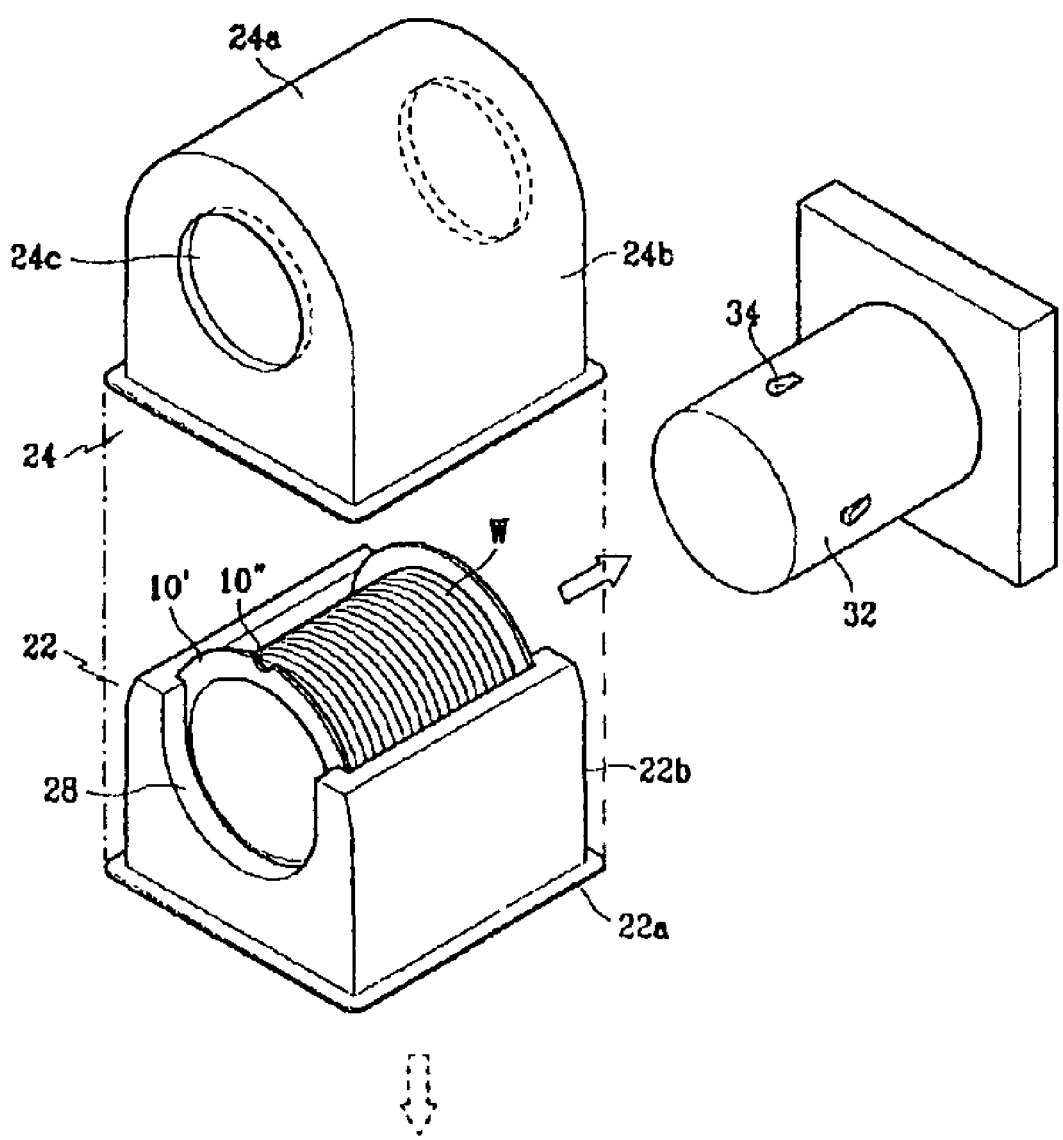
FIG. 3 is a perspective view of the spool case shown in FIG. 1 illustrating the usage thereof.

FIG. 1 is an exploded perspective view of a spool case with a cover and a base according to a preferred embodiment of the present invention, and FIG. 2 is a perspective view of the base shown in FIG. 1 mounting a spool therein.

As shown in the drawings, the spool 10, well known in the art, bears a bonding wire W around it. The spool 10 is formed with a cylinder portion (not shown) for winding the bonding wire W thereon, and a pair of flange portions 10' provided at both ends of the cylinder portion. A notch 10" is formed at the flange portion 10' to pass the bonding wire W. The bonding wire W passed the notch 10" is fastened to the outer surface of the flange portion 10' by way of a tape (not shown).

The spool case 20 for receiving the spool 10 is provided with a base 22 and a cover 24. The spool case 20 is formed with a material based on synthetic resin such as acryl, polyolefin and styrene.

The base 22 has a bottom portion 22a, and a sidewall 22b protruded from the bottom port ion 22a at the four sides thereof to form a body. A spool receipt portion 26 is made at the base 22 by way of the sidewall 22b.

The spool receipt portion 26 is outlined with a curvature identical to the outer circumference of the flange portion 10', or as shown in the drawing, with a U-lettered shape such that it can support the outer circumference of the flange portion 10' at three points.

A holder entrance 28 is formed at one or preferably two lateral sides of the sidewall 22b facing each other to make passage of the spool holder (not shown). In this preferred embodiment, the holder entrance 28 is formed with a semi-oval groove. The holder entrance 28 makes the spool holder (not shown) be entirely inserted into the inner diameter portion of the spool 10 from the one side of the base 22. In this way, it becomes possible to use the spool case 20 irrespective of the length of the spool holder (not shown). The width W1 of the holder entrance 28 is established to be smaller than the width W2 of the sidewall 22b. Consequently, when the base 22 moves in the horizontal direction, the inner surface of the sidewall 22b with the holder entrance 26 contacts the flange portion 10' of the spool 10. Therefore, the spool 10 can be coupled to or decoupled from the spool holder (not shown) through moving the base 22 in the horizontal direction.

With the above structure, the spool is horizontally received in the spool receipt portion 26 of the base 22 such that the central axis thereof can be kept to be in the horizontal direction. In this state, the flange portion 10' of the spool 10 is supported by the sidewall 22b. With the conventional spool case, the base or the cover should be provided with a protrusion to make the central axis of the spool be kept to be in the horizontal direction. By contrast, with the inventive spool case 20, the horizontal receipt of the spool 10 can be made without such a protrusion, and hence, the structure of the spool case 20 can be simplified.

As the spool 10 is placed within the spool receipt portion 26, the spool 10 can be handled without directly touching it by hand. The holding of the spool 10 is not released unless the spool 10 is intentionally separated from the base 22. Furthermore, the spool 10 can be decoupled from the base 22 without elastically transforming the base 22. Therefore, the durability of the spool and the reliability in the spool holding can be prevented from being deteriorated.

The cover 24 is fitted to the outer surface of the sidewall 22b from the top of the base 22 such that the bonding wire W of the spool 10 is prevented from being contaminated due to dust. The cover 24 has a top portion 24a with a curvature identical to or similar to the spool 10. A lateral portion 24b is bent from the top portion 24a while being fitted to the sidewall 22b of the base 22. A knob 24c is formed at the lateral portion 24b corresponding to the holder entrance 28 while being protruded toward the spool receipt portion 26.

The knob 24c is circular and planar while bearing a diameter smaller than the inner diameter of the spool 10. The protrusion length of the knob 24c is established to be smaller than the thickness of the sidewall 22b.

The spool 10 wound with a bonding wire W thereon is mounted to the spool receipt portion 26 from the top of the base 22 such that the spool 10 is placed at the spool receipt portion 26. The cover 24 is coupled to the base 22 from the top. In this state, the spool case 20 is put on a table such that the bottom portion 22a is positioned downwards.

As the central axis of the spool 10 is maintained to be in the horizontal direction, the bonding wire W wound on the spool 10 deals well with its own load, vibration in its movement and other impacts over its entire length so that the unintended winding or releasing of the wire call be effectively prevented while prohibiting the rolling of the spool case 20.

In case the spool 10 is fitted to the spool holder 32 of the wire bonding assembly (not shown), one hand laterally grips the bottom portion 22a of the base 22 and, in that state, the other hand grips the knob 24c of the cover 24. Thereafter, the cover 24 is lifted upward to thereby separate the cover 24 from the base 22. When the holder entrance 28 of the base 22 faces the spool holder 32, the base 22 moves toward the spool holder 32 in the arrow (solid line) direction to thereby fit the spool 10 to the spool holder 32. The spool 10 is fixed by a spool fixation member 34 of the spool holder 32.

Thereafter, the base 22 is pulled in the direction perpendicular to the spool mounting direction (indicated by the arrow) to thereby release the coupling of the spool 10 to the base 22.

It is possible to pull the base 22 left or right in the direction perpendicular to the spool holder 32.

In order to make the exchange of the spool 10, the base 22 moves from the bottom of the spool 10 fitted to the spool holder 32 to the top (in the direction contrary to the arrow direction) to thereby place the spool 10 at the spool receipt portion 26. Then, the base 22 moves in the direction contrary to the spool mounting direction, that is, in the direction contrary to the arrow direction so that the spool 10 is separated from the spool holder 32 while being positioned at the spool receipt portion 26.

Accordingly, it becomes possible to make coupling or decoupling of the spool without touching the spool by hand.

With the inventive spool case, the spool is mounted to the spool receipt portion from the top of the base to the bottom thereof, stress concentration is not made at any portion of the base.

Accordingly, the durability deterioration with the conventional spool case where the coupling or decoupling of the spool is made through elastically transforming the coupling member and the base is prevented.

As any portion is not worn out or stunt at the coupling or decoupling of the spool, reliability in the spool holding can be enhanced.

When the spool is mounted to the base, the conventional spool case is vibrated in the weighted direction of the spool. With the inventive spool case, as the gripping of the spool is made in the horizontal direction, such a vibration can be prevented. The bonding wire wound on the spool is an extremely minute wire of about 20 $\mu$m. Such a minute wire is correctly wound on the spool according to the programmed procedure of a computer. Therefore, the state of the bonding wire wound on the spool can be maintained in a stable manner.

The spool case is extensively used in various kinds of wire bonding assemblies irrespective of the length of the spool holder or the presence of the spool fixation member. Furthermore, the spool case is simplified in structure because any separate component (conventionally, like the protrusion for insertion) is not needed to make the central axis of the spool be kept in the horizontal direction.

With the inventive spool case, when the worker grips the base to separate the cover form the base or to mount the spool to the spool holder of the wire bonding assembly, the spool holding of the slide coupling member is not released due to the carelessness of the worker Accordingly, the contamination and damages of the bonding wire pursuant to the separation of the spool from the base can be prevented.

While the present invention has been described in detail with reference to the preferred embodiments, those skilled in the art will appreciate that various modifications and substitutions can be made thereto without departing from the spirit and scope of the present invention as set forth in the appended claims.

We claim:

1. A spool case, comprising:
    a base having a bottom portion, a sidewall protruding from the bottom portion at four sides to form a body that internally defines a spool receipt portion, and a holder entrance formed in at least one side of the sidewall so as to permit passage of a spool holder, a spool wound with a bonding wire thereon mounted to the spool receipt portion in a horizontal direction so that a central axis of the spool is maintained parallel to the bottom portion of the base; and
    a cover coupled to the base at an outer surface of the sidewall so as to prevent foreign material from entering the case.

2. The spool case of claim 1, wherein the sidewall is configured to support the spool horizontally placed at the spool receipt portion at a height of at least half the spool.

3. The spool case of claim 1, wherein the spool receipt portion is configured to support an outer circumference of flange portions provided at both ends of the spool at three points.

4. The spool case of claim 1, wherein the holder entrance is provided at two opposed lateral sides of the sidewall.

5. The spool case of claim 4, wherein the holder entrance has a semi-oval groove.

6. The spool case of claim 5, wherein a pair of knobs are arranged on the cover so as to face each other.

7. The spool case of claim 6, wherein each knob is arranged to protrude toward the spool receipt portion while being positioned corresponding to the semi-oval grooved holder entrance.

8. The spool case of claim 7, wherein the knobs have a protrusion length that is smaller than a thickness of the sidewall.

9. A method of handling a spool using a spool case having a base having a bottom portion, a sidewall protruding from the bottom portion at four sides to form a body that internally defines a spool receipt portion, and a holder entrance formed in at least one side of the sidewall so as to permit passage of a spool holder, a spool wound with a bonding wire thereon mounted to the spool receipt portion in a horizontal direction so that a central axis of the spool is maintained parallel to the bottom portion of the base, and a cover coupled to the base at an outer surface of the sidewall so as to prevent foreign material from entering the case, the method comprising the steps of selectively coupling and decoupling the spool to and from the spool holder by sliding the base in a direction perpendicular to the spool holder without directly touching the spool by hand.

10. The method of claim 9, including sliding the base downward in the direction perpendicular to the spool holder.

* * * * *